United States Patent
Paryani (10) Patent No.: US 11,415,635 B2
(45) Date of Patent: *Aug. 16, 2022

(54) DETERMINING BATTERY DC IMPEDANCE (71) Applicant: Tesla, Inc., Austin, TX (US)

(72) Inventor: Anil Paryani, Cerritos, CA (US)

(73) Assignee: Tesla, Inc., Austin, TX (US)

( * ) Notice: Subject to any disclaimer, the term of this patent is extended or adjusted under 35 U.S.C. 154(b) by 500 days.

This patent is subject to a terminal disclaimer.

(21) Appl. No.: 16/420,636

(22) Filed: May 23, 2019

(65) Prior Publication Data
US 2019/0283617 A1 Sep. 19, 2019

Related U.S. Application Data (63) Continuation of application No. 14/628,568, filed on Feb. 23, 2015, now Pat. No. 10,300,798, which is a (Continued)

(51) Int. Cl.
G01R 31/389 (2019.01)
G01R 31/392 (2019.01)
(Continued)

(52) U.S. Cl.
CPC ......... *G01R 31/389* (2019.01); *G01R 31/392* (2019.01); *H02J 7/0071* (2020.01); *B60L 58/10* (2019.02); *Y02T 10/70* (2013.01)

(58) Field of Classification Search
CPC ........ B60L 53/14; B60L 58/10; H02J 7/0071; G01R 31/392; G01R 31/389; Y02T 10/7011; Y02T 10/7005; Y02T 10/705
See application file for complete search history.

(56) References Cited

U.S. PATENT DOCUMENTS 5,786,640 A 7/1998 Sakai et al.
6,229,285 B1 5/2001 Ding
(Continued)

FOREIGN PATENT DOCUMENTS

JP 2004271342 9/2004
JP 2005091217 4/2005
(Continued)

OTHER PUBLICATIONS

European Application No. 10011183.0, extended European Search Report dated Oct. 11, 2013, 5 pages.

Primary Examiner — Alexander Satanovsky
(74) Attorney, Agent, or Firm — Knobbe Martens Olson & Bear LLP (57) ABSTRACT A controller for use in a battery charging system includes processing circuitry configured to perform certain tasks during battery charging operations, and other tasks during operational use of the battery. During a charging operation, the controller receives a measured DC impedance of a propulsion battery measured by a battery data acquisition and monitoring subsystem, obtains a reference DC impedance of a hypothetical battery, and determines an impedance degradation factor of the propulsion battery using the measured DC impedance and the reference DC impedance. During operational use of the propulsion battery, the controller obtains an operational reference impedance of the propulsion battery, determines a real-time effective impedance for the propulsion battery based on the impedance degradation factor and the operational reference impedance, and generates a feed-forward parameter based on the real-time effective impedance.

20 Claims, 2 Drawing Sheets

Related U.S. Application Data continuation of application No. 12/570,745, filed on Sep. 30, 2009, now Pat. No. 8,965,721.

(51) Int. Cl.
 *H02J 7/00* (2006.01)
 *B60L 58/10* (2019.01)

(56) References Cited

U.S. PATENT DOCUMENTS

| | | |
|---|---|---|
| 6,469,512 B2 | 10/2002 | Singh et al. |
| 6,565,836 B2 | 5/2003 | Ovshinsky et al. |
| 7,786,734 B2 | 8/2010 | Andersson |
| 7,962,300 B2 | 6/2011 | Machiyama |
| 2004/0257043 A1* | 12/2004 | Takaoka ............... H02J 7/0029 320/132 |
| 2006/0033475 A1 | 2/2006 | Moore |
| 2007/0001679 A1 | 1/2007 | Cho et al. |
| 2007/0166617 A1* | 7/2007 | Gozdz ................... H01M 4/133 429/231.95 |
| 2008/0120050 A1 | 5/2008 | Iwane et al. |
| 2008/0169819 A1* | 7/2008 | Ishii ..................... G01R 31/389 324/430 |
| 2008/0204031 A1* | 8/2008 | Iwane ................. G01R 31/389 324/430 |
| 2009/0099802 A1 | 4/2009 | Barsoukov et al. |
| 2010/0153038 A1* | 6/2010 | Tomura .............. G01R 31/3842 702/63 |
| 2011/0049977 A1 | 3/2011 | Onnerud et al. |
| 2011/0073392 A1 | 3/2011 | Collins et al. |

FOREIGN PATENT DOCUMENTS

| | | |
|---|---|---|
| JP | 2006-250905 | 9/2006 |
| JP | 2008157757 | 7/2008 |
| JP | 2008253129 | 10/2008 |

* cited by examiner

DETERMINING BATTERY DC IMPEDANCE

CROSS REFERENCE TO RELATED APPLICATIONS

The present U.S. Utility Patent Application claims priority pursuant to 35 U.S.C. § 120 as a continuation of U.S. Utility application Ser. No. 14/628,568, entitled "DETERMINING BATTERY DC IMPEDANCE", filed Feb. 23, 2015, which is a continuation of U.S. Utility application Ser. No. 12/570,745, entitled "DETERMINING BATTERY DC IMPEDANCE," filed Sep. 30, 2009, now U.S. Pat. No. 8,965,721 issued on Feb. 24, 2015, all of which are hereby incorporated herein by reference in their entirety and made part of the present U.S. Utility Patent Application for all purposes.

BACKGROUND OF THE INVENTION

The present invention relates generally to estimations of health for batteries used in heavy power use applications, and more particularly to a state of health for electric vehicle and hybrid vehicle batteries and battery packs.

It is important for users and manufacturers of vehicles using batteries that the health and performance of those batteries be monitored. Batteries lose power and capacity (the specific mechanisms of that loss vary based upon cell chemistry) therefore it is important that the power and capacity be known to aid in service diagnostics and power limit algorithms during usage. The following description is specifically focused on lithium-ion chemistry but other chemistries may be benefited from the following description.

Current techniques for monitoring the battery health include battery capacity measurements and estimates. This is an important battery parameter, but it is the case that a battery having sufficient capacity may cause a user, under certain conditions, to experience a sudden loss in available power from the battery.

One way to estimate available power is based upon measurement of AC impedances of the batteries, using conventional techniques such as Kalman filtering. Knowledge of AC impedance allows accurate real-time DC power estimation. However, since the real-time impedance is a function of state of charge and health, this estimation does not indicate the relative degradation in power to a fresh pack.

A current method for estimating available power uses a look-up table. The table uses information about temperature, state of charge (SOC), and battery age to predict and estimate available power. This predictive method fails to account for varying degrees of degradations in battery chemistry that occur over long periods that result from varying operating environments. For example, a user operating an electric vehicle in a hot climate may experience shorter battery life due to high temperature usage.

What is needed is an apparatus and method to measure battery degradation in contrast to conventional techniques of predicting the battery degradation.

BRIEF SUMMARY OF THE INVENTION

Disclosed is a method and apparatus for measuring battery cell DC impedance by controlling charging of the battery cell. The method includes real-time characterization of a battery, (a) measuring periodically a DC impedance of the battery to determine a measured DC impedance; (b) ratioing the measured DC impedance to a reference DC impedance for the battery to establish an impedance degradation factor; (c) obtaining, during use of the battery and responsive to a set of attributes of the battery, an operational reference impedance for the battery; (d) applying the impedance degradation factor to the operational reference impedance to obtain a real-time effective impedance for the battery; and (e) managing the battery temperature to a warm temperature so that the user does not notice a delay in charging time when measuring the DC impedance.

The apparatus includes a battery charging system for a battery having a charger coupled to the battery, a controller, and a battery data acquisition and monitoring subsystem wherein the controller: measures periodically a DC impedance of the battery to determine a measured DC impedance; ratios the measured DC impedance to a reference DC impedance for the battery to establish an impedance degradation factor; obtains, during use of the battery and responsive to a set of attributes of the battery acquired by the battery data acquisition and monitoring subsystem, an operational reference impedance for the battery; and applies the impedance degradation factor to the operational reference impedance to obtain a real-time effective impedance for the battery. Various functions and structures of this system may be divided or integrated together into different elements than described herein.

Embodiments of the present invention provide apparatus and method to measure battery degradation directly. Knowing both available power and current capacity helps the operator of an apparatus, like an electric vehicle, avoid dangerous uses of the apparatus that they may be otherwise able to avoid should they have a better representation of available power. In terms of manufacturers and maintenance, accurate impedance measurement, in cooperation with battery capacity, provides a more reliable indicator of the state of health of the battery as compared to battery capacity alone.

Knowing the available power is important in other aspects of use of the battery. For electric vehicles, there is a specification regarding available sustained peak power which is directly related to available power. In application of an electric vehicle, for those without the embodiments of the present invention, it may be the case that a user initiates a maneuver with increased risk (e.g., passing another vehicle) and the duration of the sustained power peak cannot be maintained for the expected duration. The user experiences what appears to be a sudden loss in power which can have many different consequences depending upon the situation and how the user reacts. Embodiments of the present invention may be used as a feed-forward control path to pre-restrict operation to power levels that can be sustained for specified periods.

DETAILED DESCRIPTION OF THE INVENTION

Embodiments of the present invention provide a system and method for measuring battery degradation in contrast to conventional techniques of predicting the battery degradation, particularly for lithium-ion battery cells. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
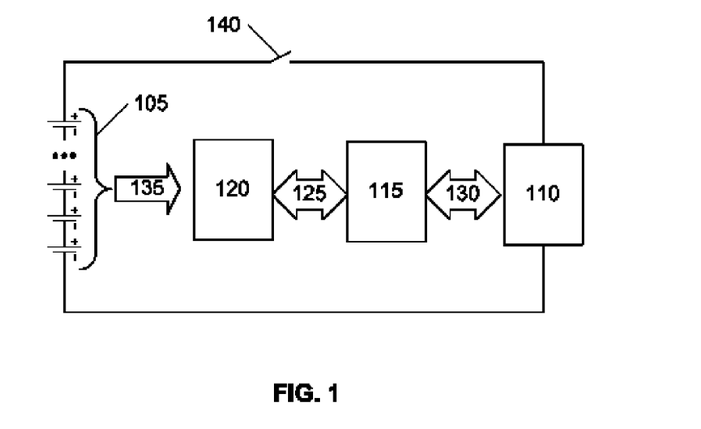
FIG. 1 is a representative charging system.

FIG. 1 is a preferred embodiment for a charging system 100, such as may be used in an electric vehicle. System 100 includes a battery 105, a charger 110 coupled to battery 105 and a battery management system (BMS) 115 and a battery data acquisition and monitoring subsystem 120. A communication bus 125 couples subsystem 120 to BMS 115 and a communication bus 130 couples BMS 115 to charger 110. A communication bus 135 couples battery data from battery 105 to subsystem 120.

Battery 105 is shown as a series-connected group of battery cells, however the arrangement of cells may be a combination of parallel/series connected cells of many different arrangements. Charger 110 of the preferred embodiment provides the charging current applied to battery 105. BMS 115 controls the charging current according to a profile established by the embodiments of the present invention. Subsystem 120 acquires the desired data as described herein regarding battery 105. For example, voltage, SOC, temperature, and other applicable data used by BMS 115. In some embodiments, subsystem 120 may be part of BMS 115 and BMS 115 may be part of charger 110. One or more of charger 110, BMS 115, and subsystem 120 control a switch 140. Again, the organization, arrangement, and distribution of the functions described herein may be provided other than as described in this exemplary embodiment.

Figure 2:
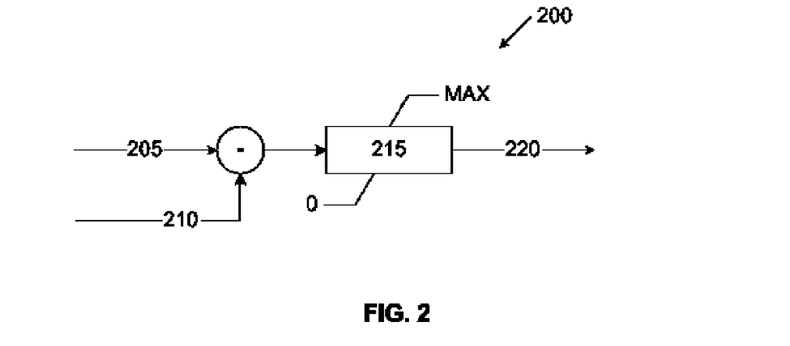
FIG. 2 is a control diagram for the charging system shown in FIG. 1.

FIG. 2 is a control diagram 200 for the charging system shown in FIG. 1. Diagram 200 describes a typical control system as may be used for charging lithium ion cells. A target voltage 205 and a maximum cell voltage 210 are subtracted and used by a controller 215 to produce a charging current 220. In prior art systems, current 220 is constant or compensates for an internal resistance (IR) drop of battery 105. As described above, the preferred embodiments of the present invention describe a measurement system for actual DC impedance. In broad terms, the measurement of real-time DC impedance permits calculation of available current/available power which may be used in a variety of ways including representing a state-of health of a battery and providing a feed-forward parameter that may be used to indicate/control a current level of sustained peak power.

Lithium ion batteries are common in consumer electronics. They are one of the most popular types of battery for portable electronics, with one of the best energy-to-weight ratios, no memory effect, and a slow loss of charge when not in use. In addition to uses for consumer electronics, lithium-ion batteries are growing in popularity for defense, automotive, and aerospace applications due to their high energy and power density. However, certain kinds of treatment may cause Li-ion batteries to fail in potentially dangerous ways.

One of the advantages of use of a Li-ion chemistry is that batteries made using this technology are rechargeable. Traditional charging is done with a two-step charge algorithm: (i) constant current (CC), and (ii) constant voltage (CV). In electric vehicles (EVs), the first step could be constant power (CP).

Step 1: Apply charging current limit until the volt limit per cell is reached.

Step 2: Apply maximum volt per cell limit until the current declines below a predetermined level (often C/20 but sometimes C/5 or C/10 or other value).

The charge time is approximately 1-5 hours, depending upon the application. Generally cell phone type of batteries can be charged at 1 C, laptop types 0.8 C. The charging typically is halted when the current goes below C/10. Some fast chargers stop before step 2 starts and claim the battery is ready at about a 70% charge. (As used herein, "C" is a rated current that discharges the battery in one hour.)

Generally for consumer electronics, lithium-ion is charged with approximate 4.2.+/−0.0.05 V/cell. Heavy automotive, industrial, and military application may use lower voltages to extend battery life. Many protection circuits cut off when either >4.3 V or 90° C. is reached.

Battery chargers for charging lithium-ion-type batteries are known in the art. As is known in the art, such lithium ion batteries require constant current (CC) and constant voltage (CV) charging. In particular, initially such lithium ion batteries are charged with a constant current. In the constant current mode, the charging voltage is typically set to a maximum level recommended by the Li-ion cell manufacturer based on safety considerations, typically 4.2V per cell. The charging current is a factor of design level, based on the cell capability, charge time, needs and cost. Once the battery cell voltage rises sufficiently, the charging current drops below the initial charge current level. In particular, when the battery cell voltage Vb approaches the charging voltage Vc, the charging current tapers according to the formula: I=(Vc−Vb)/Rs, where I=the charging current, Vc=the charging voltage, Vb=the battery cell open circuit voltage and Rs=the resistance of the charging circuit including the contact resistance and the internal resistance of the battery cell. As such, during the last portion of the charging cycle, typically about the last ⅓, the battery cell is charged at a reduced charging current, which means it takes more time to fully charge the battery cell.

The closed-circuit voltage represents the voltage of the battery cell plus the voltage drops in the circuit as a result of resistance in the battery circuit, such as the battery terminals and the internal resistance of the battery cell. By subtracting the closed-circuit voltage from the open-circuit voltage, the voltage drop across the battery resistance circuit elements can be determined.

Figure 3:
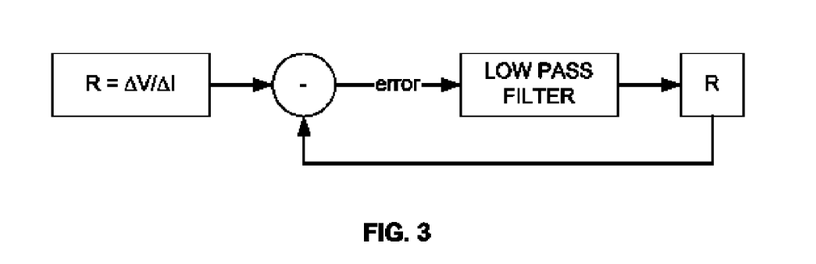
FIG. 3 is a second control diagram for the charging system shown in FIG. 1 for dampening effects of noise, temperature variation, and measurement inaccuracies during the process described in FIG. 4.

FIG. 3 is a second control diagram for the charging system shown in FIG. 1 for dampening effects of noise, temperature variation, and measurement inaccuracies during the process described in FIG. 4 below. The control is an implementation of a low-pass filter to help reduce variations from the noise, temperature variation, and measurement inaccuracies.

Figure 4:
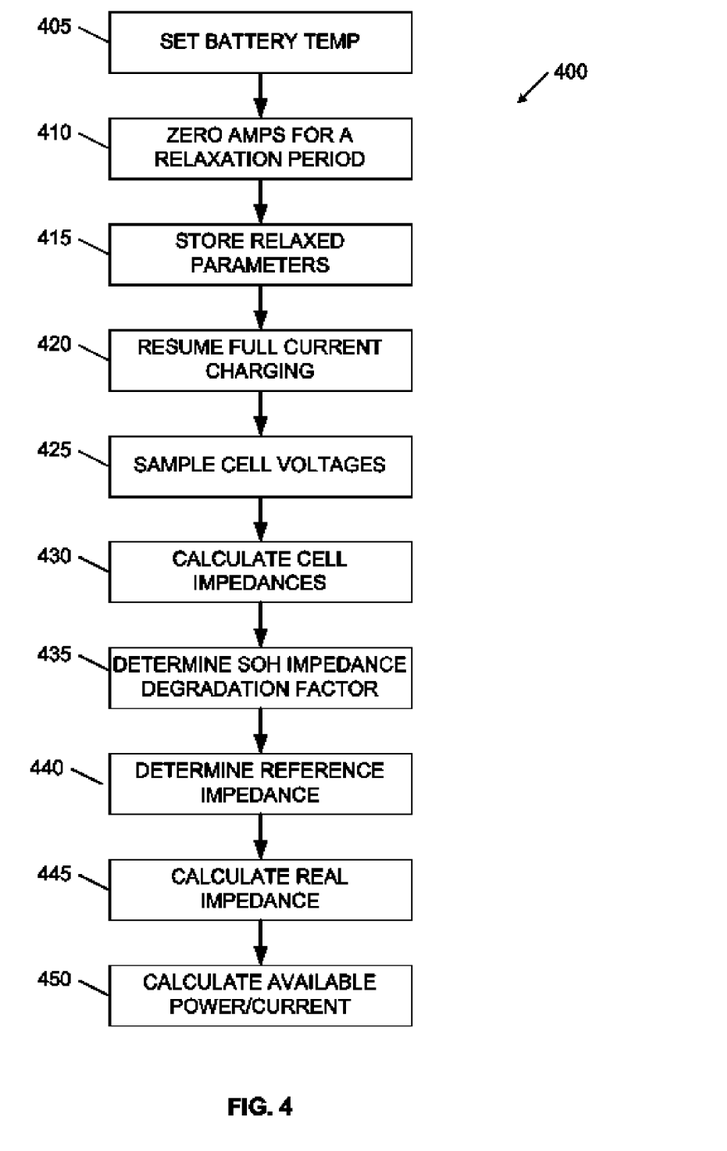
FIG. 4 is a process diagram for the charging system shown in FIG. 1.

FIG. 4 is a diagram for a process 400 implemented by charging system 100 shown in FIG. 1. Process 400 calculates power or current available. The calculation shown is described for individual cells of a multicell battery pack. For pack power or pack current, all cell values are summed. Process 400 is implemented every one to four weeks when the battery is being charged (preferably at night) and when the battery is about sixty percent state-of-charge (SOC). For the discussion below, the term "battery" is used to simplify the discussion. In the preferred implementation, the battery is a multi-cell pack and when the term "battery" is used, it may be exchanged for cell and applicable to each cell of the battery pack, unless the context implies differently.

Process 400 begins with step 405 to set battery temperature. This step warms the battery and keeps the battery (cells) at a desired temperature, in the preferred embodiment this temperature is approximately thirty-five degrees Celsius. This may be managed in multiple different ways, for example based upon coolant flow from the previous drive cycle. Air and/or liquid or other cooling mechanism is used to equalize cell temperature at the desired level before proceeding with process 400.

After step 405, process 400 charges the battery in desired fashion until the average SOC of the battery reaches about a fixed predetermined percent SOC (typically around sixty percent SOC). The particular value chosen is based upon application and other design considerations. There are some trade-offs in selecting the desired SOC for this step. Between 40% and 100% SOC, DC impedance of a battery tends to be flat. Also, for Cobalt cells, the OCV/SOC curve is flat at values <55% SOC. It is the case that various applications and usage patterns will help determine some of these values. For example, some patterns of usage may have users discharge their batteries further than other applications before recharging. It is desirable to base the threshold on typical user discharge patterns. In some applications, a value for SOC is chosen >60% when the SOC is accurate and the impedance is flat and users typically operate their vehicle into this SOC. For longer range batteries, some users may only drive the vehicle down to 70% SOC, in which case the selected value of 70% may be more desired. There are disadvantages to choosing too high of an SOC. For example, the battery may start hitting the taper voltage.

Step 410 has charging system 100 command zero amps from the charger to the battery for a relaxation period. The relaxation period of the preferred implementation is on the order of about five minutes. This relaxation period permits the battery to depolarize. The actual period may vary from five minutes, especially as the battery ages or varies from the desired temperature or when higher charge currents are used.

After the conclusion of the relaxation period of step 410, process 400 performs step 415 of storing relaxed parameters. In the preferred embodiment, the relaxed battery voltage is measured and stored.

Next, after step 415, process 400 performs step 420 and resumes full-current charging. In the preferred embodiment, the charge current is desirably at least about C/3. This level increases accuracy of the DC impedance measurement reducing cell voltage/current measurement errors.

Following step 420, process 400 performs step 425 to sample cell voltages. Preferably, step 425 is implemented after a sustained peak power period lapses. For many electric vehicles in conventional usage, it is determined that the sustained peak power period should be on the order of about ten seconds. For some applications, it may be that the sustained peak power be eighteen seconds. This value is determined by the application of the battery. Step 430, following step 425, calculates an impedance for each cell. The impedance R is the change in voltage divided by the change in current ($\Delta V/\Delta I$).

The preferred implementation uses the low pass filter shown in FIG. 3 to measure the impedance of each cell. Other implementations of the low pass filter may be desirable, depending upon a variety of factors.

Once the measured impedance for each cell is calculated, process 400 performs step 435 to determine a state-of-health (SoH) impedance degradation factor. This factor is a ratio of the measured impedance from step 430 to a "reference" impedance that represents the impedance of a fresh, newly manufactured battery. This ratio will be a value less than 1.0.

During operation (e.g., while driving an electric vehicle using the battery), process 440 (at step 440) determines a reference impedance for the battery. Preferably step 440 uses a look-up table that is responsive to SoC and battery temperature to establish the reference impedance. Next process 400 performs step 445 to calculate the real DC impedance. The real DC impedance equals the SOH factor from step 435 multiplied times the reference impedance. This real-time DC impedance value may be used for different purposes. It is used in step 450 of process 400 of the preferred embodiment to calculate the available power/current of the battery. (For power, the calculation represents an individual cell so that all cell power limits are summed to get a total power available for the battery pack.) In the following, DchILimit is the Discharge Current Limit, $V_{min}$ is a value determined by the manufacturer for the particular application, $V_{cell}$ is the actual voltage level of the battery, and R is the real-time DC impedance value from step 445. $V_{min}$ is typically around three volts for consumer batteries and about two and seven tenths volts for electric vehicles. $V_{max}$ is a manufacturer determined maximum cell voltage. $V_{min}$ and $V_{max}$ are typically constant but may vary by temperature. Embodiments of the present invention may use a dynamic value for these voltages when necessary or desirable.

$$DchI\text{Limit}=(V_{min}-V_{cell})/R$$

$$DchP\text{Limit}=DchI\text{Limit}*V_{min}$$

$$ChgI\text{Limit}=(V_{max}-V_{cell})/R$$

$$ChgP\text{Limit}=ChgI\text{Limit}*V_{max}$$

The system above has been described in the preferred embodiment of an embedded automobile (EV) electric charging system. The system, method, and computer program product described in this application may, of course, be embodied in hardware; e.g., within or coupled to a Central Processing Unit ("CPU"), microprocessor, microcontroller, digital signal processor, System on Chip ("SOC"), or any other programmable device. Additionally, the system, method, and computer program product, may be embodied in software (e.g., computer readable code, program code, instructions and/or data disposed in any form, such as source, object or machine language) disposed, for example, in a computer usable (e.g., readable) medium configured to store the software. Such software enables the function, fabrication, modeling, simulation, description and/or testing of the apparatus and processes described herein. For example, this can be accomplished through the use of general programming languages (e.g., C, C++), GDSII databases, hardware description languages (HDL) including Verilog HDL, VHDL, AHDL (Altera HDL) and so on, or other available programs, databases, nanoprocessing, and/or circuit (i.e., schematic) capture tools. Such software can be disposed in any known computer usable medium including semiconductor (Flash, or EEPROM, ROM), magnetic disk, optical disc (e.g., CD-ROM, DVD-ROM, etc.) and as a computer data signal embodied in a computer usable (e.g., readable) transmission medium (e.g., carrier wave or any other medium including digital, optical, or analog-based medium). As such, the software can be transmitted over communication networks including the Internet and intranets. A system, method, computer program product, and propagated signal embodied in software may be included in a semiconductor intellectual property core (e.g., embodied in HDL) and transformed to hardware in the production of integrated circuits. Additionally, a system, method, computer program product, and propagated signal as described herein may be embodied as a combination of hardware and software.

One of the preferred implementations of the present invention is as a routine in an operating system made up of programming steps or instructions resident in a memory of a computing system as well known, during computer operations. Until required by the computer system, the program instructions may be stored in another readable medium, e.g. in a disk drive, or in a removable memory, such as an optical disk for use in a CD ROM computer input or other portable memory system for use in transferring the programming steps into an embedded memory used in the charger. Further, the program instructions may be stored in the memory of another computer prior to use in the system of the present invention and transmitted over a LAN or a WAN, such as the Internet, when required by the user of the present invention. One skilled in the art should appreciate that the processes controlling the present invention are capable of being distributed in the form of computer readable media in a variety of forms.

Any suitable programming language can be used to implement the routines of the present invention including C, C++, Java, assembly language, etc. Different programming techniques can be employed such as procedural or object oriented. The routines can execute on a single processing device or multiple processors. Although the steps, operations or computations may be presented in a specific order, this order may be changed in different embodiments. In some embodiments, multiple steps shown as sequential in this specification can be performed at the same time. The sequence of operations described herein can be interrupted, suspended, or otherwise controlled by another process, such as an operating system, kernel, and the like. The routines can operate in an operating system environment or as standalone routines occupying all, or a substantial part, of the system processing.

In the description herein, numerous specific details are provided, such as examples of components and/or methods, to provide a thorough understanding of embodiments of the present invention. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

A "computer-readable medium" for purposes of embodiments of the present invention may be any medium that can contain, store, communicate, propagate, or transport the program for use by or in connection with the instruction execution system, apparatus, system or device. The computer readable medium can be, by way of example only but not by limitation, an electronic, magnetic, optical, electromagnetic, infrared, or semiconductor system, apparatus, system, device, propagation medium, or computer memory.

A "processor" or "process" includes any human, hardware and/or software system, mechanism or component that processes data, signals or other information. A processor can include a system with a general purpose central processing unit, multiple processing units, dedicated circuitry for achieving functionality, or other systems. Processing need not be limited to a geographic location, or have temporal limitations. For example, a processor can perform its functions in "real time," "offline," in a "batch mode," etc. Portions of processing can be performed at different times and at different locations, by different (or the same) processing systems.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

Embodiments of the invention may be implemented by using a programmed general purpose digital computer, by using application specific integrated circuits, programmable logic devices, field programmable gate arrays, optical, chemical, biological, quantum or nanoengineered systems, components and mechanisms may be used. In general, the functions of the present invention can be achieved by any means as is known in the art. Distributed, or networked systems, components and circuits can be used. Communication, or transfer, of data may be wired, wireless, or by any other means.

It will also be appreciated that one or more of the elements depicted in the drawings/figures can also be implemented in a more separated or integrated manner, or even removed or rendered as inoperable in certain cases, as is useful in accordance with a particular application. It is also within the spirit and scope of the present invention to implement a program or code that can be stored in a machine-readable medium to permit a computer to perform any of the methods described above.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed is:

1. A controller for use in a battery charging system, the controller including processing circuitry configured to:
   during a charging operation:
      initiate a relaxation period in response to a state of charge (S.O.C.) of a propulsion battery reaching a predetermined level during the charging operation;
      receive a D.C. impedance of the propulsion battery from a battery data acquisition and monitoring subsystem, the D.C. impedance determined by the battery data acquisition and monitoring subsystem during the charging operation;
      obtain a reference D.C. impedance, the reference D.C. impedance indicating an impedance associated with a new battery;
      determine an impedance degradation factor of the propulsion battery using the D.C. impedance and the reference D.C. impedance;
   during operational use of the propulsion battery:
      obtain an operational reference impedance of the propulsion battery;
      determine a real-time effective impedance for the propulsion battery based on the impedance degradation factor and the operational reference impedance; and
      generate a feed-forward parameter based on the real-time effective impedance.

2. The controller of claim 1, wherein:
   the propulsion battery includes a plurality of cells forming a multi-cell battery pack; and
   the processing circuitry is further configured to determine the impedance degradation factor for individual cells included in the multi-cell battery pack.

3. The controller of claim 1, wherein the processing circuitry is further configured to:
   determine that the propulsion battery is at a predetermined temperature prior to initiating the charging operation.

4. The controller of claim 1, wherein:
   the D.C. impedance of the propulsion battery corresponds to a measurement made after the relaxation period.

5. The controller of claim 4, wherein the processing circuitry is further configured to:
   instruct a battery charger to provide a charging current to the propulsion battery until the S.O.C. the propulsion battery reaches the predetermined level.

6. The controller of claim 5, wherein the processing circuitry is further configured to:
   set the charging current provided to the propulsion battery to zero amperes for a duration of the relaxation period.

7. The controller of claim 5, wherein the processing circuitry is further configured to:
   obtain a first voltage of the propulsion battery upon conclusion of the relaxation period;
   instruct the battery charger to resume providing a charging current to the propulsion battery;
   obtain a second voltage of the propulsion battery after the battery charger has resumed providing the charging current to the propulsion battery; and
   determine the D.C. impedance of the propulsion battery based, at least in part on a difference between the first voltage of the propulsion battery and the second voltage of the propulsion battery.

8. A method for use in a battery charging system controller, the method comprising:
   during a charging operation:
      initiating a relaxation period in response to a state of charge (S.O.C.) of a propulsion battery reaching a predetermined level during the charging operation;
      receiving at the battery charging system controller, a D.C. impedance of the propulsion battery from a battery data acquisition and monitoring subsystem, the D.C. impedance determined by the battery data acquisition and monitoring subsystem during the charging operation;
      obtaining a reference D.C. impedance, the reference D.C. impedance indicating an impedance associated with a new battery;
      determining an impedance degradation factor of the propulsion battery using the D.C. impedance and the reference D.C. impedance; during operational use of the propulsion battery:
      obtaining an operational reference impedance of the propulsion battery;
      determining a real-time effective impedance for the propulsion battery based on the impedance degradation factor and the operational reference impedance; and
      generate a feed-forward parameter based on the real-time effective impedance.

9. The method of claim 8, wherein the propulsion battery includes a plurality of cells forming a multi-cell battery pack, the method further including:
   determining the impedance degradation factor for individual cells included in the multi-cell battery pack.

10. The method of claim 8, further comprising:
    determining that the propulsion battery is at a predetermined temperature prior to initiating the charging operation.

11. The method of claim 8, wherein the D.C. impedance of the propulsion battery corresponds to a measurement made after a relaxation period.

12. The method of claim 11, further including:
    instructing a battery charger to provide a charging current to the propulsion battery until the S.O.C. of the propulsion battery reaches a predetermined level.

13. The method of claim 12, further including:
    setting the charging current provided to the propulsion battery to zero amperes for a duration of the relaxation period.

14. The method of claim 12, further including:
    obtaining a first voltage of the propulsion battery upon conclusion of the relaxation period;
    instructing the battery charger to resume providing a charging current to the propulsion battery;

obtaining a second voltage of the propulsion battery after the battery charger has resumed providing the charging current to the propulsion battery; and determining the D.C. impedance of the propulsion battery based, at least in part on a difference between the first voltage of the propulsion battery and the second voltage of the propulsion battery.

15. A battery charging system comprising:
a battery data acquisition and monitoring subsystem;
a battery charger;
a controller coupled to the battery data acquisition and monitoring subsystem and the battery charger, the controller configured to:
during a charging operation:
  initiate a relaxation period in response to a state of charge (S.O.C.) of a propulsion battery reaching a predetermined level during the charging operation;
  receive a D.C. impedance of a propulsion battery from the battery data acquisition and monitoring subsystem;
  obtain a reference D.C. impedance, the reference D.C. impedance indicating an impedance associated with a new battery;
  determine an impedance degradation factor of the propulsion battery using the D.C. impedance and the reference D.C. impedance;
during operational use of the propulsion battery:
  obtain an operational reference impedance of the propulsion battery;
  determine a real-time effective impedance for the propulsion battery based on the impedance degradation factor and the operational reference impedance; and
  generate a feed-forward parameter based on the real-time effective impedance.

16. The battery charging system of claim 15, wherein the controller is further configured to:
determine that the propulsion battery is at a predetermined temperature prior to initiating the charging operation.

17. The battery charging system of claim 15,
wherein the D.C. impedance of the propulsion battery corresponds to a measurement made by the battery data acquisition and monitoring subsystem after the relaxation period.

18. The battery charging system of claim 17, wherein the controller is further configured to:
instruct the battery charger to provide a charging current to the propulsion battery until the S.O.C. of the propulsion battery reaches a predetermined level.

19. The battery charging system of claim 17, wherein the controller is further configured to:
set the charging current provided to the propulsion battery to zero amperes for a duration of the relaxation period.

20. The controller of claim 17, wherein the controller is further configured to:
obtain a first voltage of the propulsion battery, from the battery data acquisition and monitoring subsystem, upon conclusion of the relaxation period;
instruct the battery charger to resume providing a charging current to the propulsion battery;
obtain a second voltage of the propulsion battery, the battery data acquisition and monitoring subsystem, after the battery charger has resumed providing the charging current to the propulsion battery; and
determine the D.C. impedance of the propulsion battery based, at least in part on a difference between the first voltage of the propulsion battery and the second voltage of the propulsion battery.

* * * * *

UNITED STATES PATENT AND TRADEMARK OFFICE
CERTIFICATE OF CORRECTION

PATENT NO. : 11,415,635 B2
APPLICATION NO. : 16/420636
DATED : August 16, 2022
INVENTOR(S) : Anil Paryani It is certified that error appears in the above-identified patent and that said Letters Patent is hereby corrected as shown below:

In the Specification

In Column 4, Line 14, delete "4.2.+/-0.0.05" and insert -- 4.2.+/-.0.05 --.

In the Claims

In Column 9, Line 64, Claim 5, after "S.O.C." insert -- of --.

Signed and Sealed this
Thirty-first Day of January, 2023

Katherine Kelly Vidal
*Director of the United States Patent and Trademark Office*